US009281224B2

(12) United States Patent
Jost

(10) Patent No.: US 9,281,224 B2
(45) Date of Patent: Mar. 8, 2016

(54) APPARATUS FOR POSITIONING POWER SEMICONDUCTOR MODULES AND METHOD FOR SURFACE TREATMENT THEREOF

(75) Inventor: Jakob Jost, Langenzenn (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 489 days.

(21) Appl. No.: 11/593,355

(22) Filed: Nov. 6, 2006

(65) Prior Publication Data

US 2007/0105275 A1    May 10, 2007

(30) Foreign Application Priority Data

Nov. 5, 2005   (DE) .................... 10 2005 052 798

(51) Int. Cl.
*B65D 85/00* (2006.01)
*H01L 21/673* (2006.01)

(52) U.S. Cl.
CPC ... *H01L 21/67333* (2013.01); *H01L 2924/0002* (2013.01)

(58) Field of Classification Search
CPC ....................................................... B65D 85/00
USPC ......... 206/701, 707, 710–714, 716, 832, 557, 206/558, 562–565, 725, 724; 53/450, 473, 53/428; 439/73; 427/471
See application file for complete search history.

(56) References Cited

U.S. PATENT DOCUMENTS

| 4,529,088 | A | * | 7/1985 | Quong | 206/509 |
|---|---|---|---|---|---|
| 5,492,223 | A | * | 2/1996 | Boardman et al. | 206/710 |
| 5,791,486 | A | * | 8/1998 | Brahmbhatt | 206/725 |
| 5,794,783 | A | * | 8/1998 | Carter | 206/725 |
| 5,878,890 | A | * | 3/1999 | Kaneko | 206/714 |
| 5,960,961 | A | * | 10/1999 | Gutentag | 206/714 |
| 6,484,881 | B1 | * | 11/2002 | Alvite | 206/714 |
| 6,644,982 | B1 | * | 11/2003 | Ondricek et al. | 439/73 |
| 6,719,141 | B2 | * | 4/2004 | Heinz et al. | 206/563 |
| 6,914,771 | B2 | * | 7/2005 | Ono et al. | 361/820 |
| 6,926,937 | B2 | * | 8/2005 | Extrand et al. | 428/35.7 |
| 7,108,899 | B2 | * | 9/2006 | Extrand et al. | 428/34.1 |
| 7,228,622 | B2 | * | 6/2007 | Watson | 29/827 |
| 2003/0231469 | A1 | * | 12/2003 | Ono et al. | 361/715 |
| 2004/0000504 | A1 | * | 1/2004 | Wang | 206/725 |
| 2004/0093721 | A1 | * | 5/2004 | Watson | 29/729 |

FOREIGN PATENT DOCUMENTS

| DE | 196 30 173 | 1/1998 |
|---|---|---|
| DE | 103 58 834 | 7/2004 |

* cited by examiner

*Primary Examiner* — Jacob K Ackun
*Assistant Examiner* — Rafael Ortiz
(74) *Attorney, Agent, or Firm* — The Law Offices of Roger S. Thompson

(57) ABSTRACT

An apparatus and an associated method for receiving and positioning a plurality of spaced-apart power semiconductor modules using a molded positioning body. The molded positioning body has a planar first main face and a plurality of receptacles for receiving the power semiconductor modules therein. Each receptacle has a stop means, by which a main face of each power semiconductor module is positioned plane-parallel with one another and in alignment with the first main face of the molded positioning body. The receptacle is embodied as tapering inwardly in the direction of the first main face, beginning at the second main face.

11 Claims, 2 Drawing Sheets

APPARATUS FOR POSITIONING POWER SEMICONDUCTOR MODULES AND METHOD FOR SURFACE TREATMENT THEREOF

BACKGROUND OF THE INVENTION

1. Field of the Invention

The invention describes an apparatus for positioning a plurality of spaced-apart power semiconductor modules and a method for surface treatment of the positioned power semiconductor modules.

2. Description of the Related Art

The point of departure for the invention is, for example, a plurality of power semiconductor modules manufactured in accordance with DE 196 30 173 A1, which are disposed spaced apart from one another in a shipping package as described by DE 10 358 834 A1. Before being shipped, it is preferred that a heat-conducting layer be applied to the substrates of the power semiconductor modules, so that, after shipping, the power semiconductor modules can be disposed in an arrangement such as a current inverter immediately, without further surface treatment.

The aforementioned power semiconductor modules have two main faces, the first main face being formed by a substrate, and the second having electrical contact elements disposed therein. The first main face faces the interior of the power semiconductor module, and carries the power semiconductor components. The second main face, disposed on the side opposite to the interior of the power semiconductor module, connects the module thermally conductively to a cooling component (heat sink). This thermally conductive connection between the substrate and the cooling component is formed in the prior art by an intermediate layer comprising a heat-conducting layer of a so-called heat-conducting paste.

To assure efficient heat transfer after the power semiconductor module is mounted on the heat sink, this heat-conducting paste must be embodied as a homogeneous layer or as a homogeneous distribution of individual layer elements. Such layers of heat-conducting paste, however, have the disadvantage, being a pastelike layer, of being vulnerable to damage in terms of their homogeneity. For this reason, in the prior art, the heat-conducting paste is preferably applied immediately before the power semiconductor module is mounted on the heat sink. Since this layer, though, must have the highest possible homogeneity (or in other words a uniform layer thickness), screenprinting processes are for instance suitable for the purpose, but are not necessarily readily available at the assembly site.

Shipping packages for the aforementioned power semiconductor module are disclosed in DE 103 58 834 A1. Such shipping packages arrange a plurality of power semiconductor modules at a spacing from one another that is defined to a tolerance of only a few millimeters. Moreover, these packages are embodied such that the two main faces of each power semiconductor module do not come into contact with the shipping package, or come into contact with only a slight but defined portion thereof.

SUMMARY OF THE INVENTION

It is an object of the invention to present an apparatus for receiving a plurality of spaced-apart power semiconductor modules and for positioning them, even with a tolerance of less than 1 mm, relative to one another. It is another object of the invention to provide a method for the simultaneous surface treatment of this plurality of power semiconductor modules.

The invention includes a plurality of power semiconductor modules, which are disposed laterally to one another in a matrix that is not precisely defined, and their horizontal position with respect to one another is likewise not precisely defined. The invention describes an apparatus for receiving and positioning this plurality of spaced-apart power semiconductor modules. To that end, a molded positioning body is proposed which has a planar first main face and a plurality of receptacles for receiving the power semiconductor modules.

Each aforementioned receptacle, in the direction of the normal to the first main face, has a stop means, by which a main face of each power semiconductor module is positioned plane-parallel to one another and in alignment with the first main face of the molded body. Moreover, in at least one portion, the sides of the receptacle which contact the power semiconductor module are tapered inwardly, beginning at the second main face of the molded positioning body, in the direction of the first main face of the molded positioning body.

The associated method for simultaneous surface treatment of a plurality of power semiconductor modules makes use of the aforementioned apparatus for aligning and fixing the power semiconductor modules in their position and then employs the correspondingly suited coating method for full-surface or partial coating of the first main faces of the power semiconductor modules with a suitable material.

The invention will be described in further detail in terms of exemplary embodiments in conjunction with FIGS. 1 through 3.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
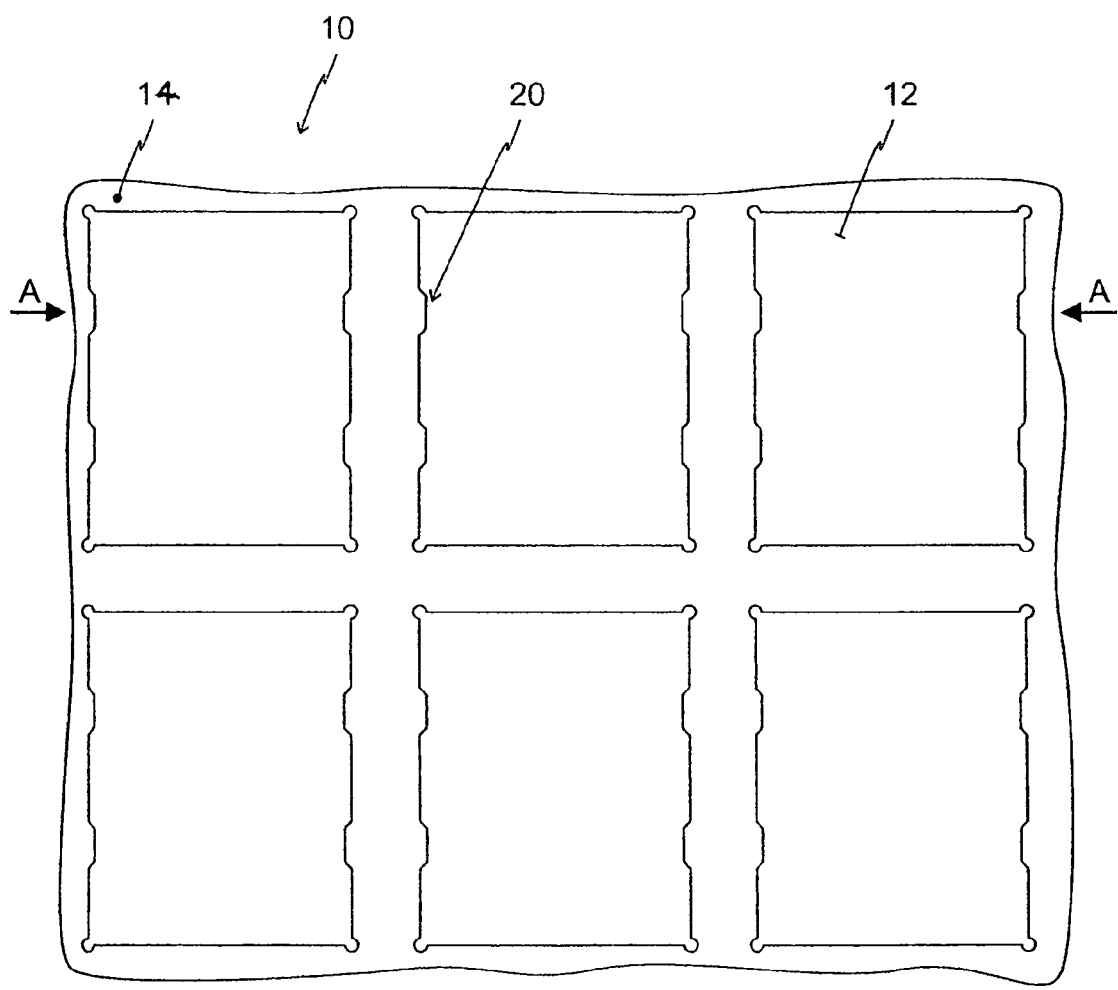
FIG. 1 shows a detail of the molded positioning body of the apparatus of the invention.

FIG. 1 shows a detail of a molded positioning body 10 of the apparatus of the invention, in a plan view of its first main face 14. Molded positioning body 10 preferably is made up of aluminum, and has a planar first main face 14. Molded positioning body 10 furthermore has a plurality of receptacles 12 formed therein, whose lateral dimensions are slightly larger than the corresponding dimensions of a power semiconductor module 40 (FIG. 2) to be disposed therein. The method to be performed by means of this molded positioning body 10 determines the corresponding sizes of receptacles 12. Each receptacle 12 has at least one stop means 20, which limits a displacement of the power semiconductor module 40 to be disposed in the direction of the surface normal to the first main face 14 of the molded positioning body 10. Stop means 20 preferably are embodied as detent lugs and are disposed on two diametrically opposed sides of the receptacle 14 of the molded positioning body 10. Depending on the need for precise positioning in any particular application, such detent lugs 20 may be placed on all sides of receptacles 12, or there may be more than one per side. Detent lugs 20 may also be placed in the corners of the receptacles 12. The precise number and positioning of detent lugs 20 is a matter of design choice.

Figure 2:
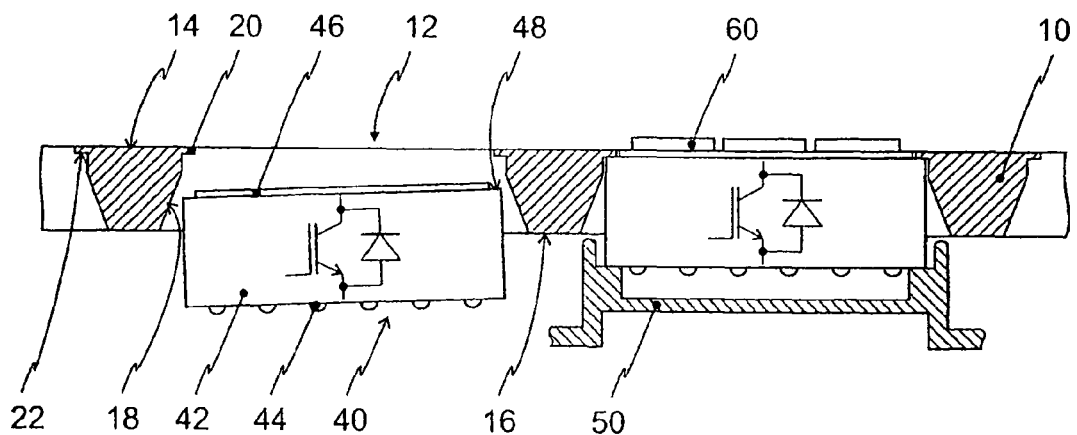
FIG. 2 shows a section through the molded positioning body of the apparatus of the invention, in various stages of the positioning of power semiconductor modules.

FIG. 2 shows a section taken along the line A-A in FIG. 1 through molded positioning body 10, in various stages of the positioning of power semiconductor modules 40 therein.

First main face 14 of molded positioning body 10 serves as a reference face for the method of the invention and a second main face 16 is disposed opposite to first main face 14. As stated, molded positioning body 10 furthermore has receptacles 12 for receiving power semiconductor modules 40. These receptacles 12 have a lateral extent which is slightly greater than the lateral extent of a housing 42 of the associated power semiconductor module 40. The lateral extent of power semiconductor module 40 is markedly larger, on the second main face 16, than the dimensions of the housing 42 of the power semiconductor module 40. Accordingly, beginning at this second main face 16, the sides of receptacle 12 taper inwardly in the direction of first main face 14 in at least one fragmentary portion 18. This embodiment is preferred, since, although the power semiconductor modules 40 before being disposed in the molded positioning body 10 are arranged generally laterally to one another in a matrix (for instance in part of a shipping package 50), but nevertheless the tolerances permitted in placing them in package 50 are greater than the tolerances in the molded positioning body 10. Thus, molded positioning body 10 allows for far greater precision in the arrangement of power semiconductor modules 40 in package 50 than heretofore realized.

Housing 42 of power semiconductor module 40 surrounds a substrate 46, and, as a result, substrate 46 forms the first main face of the power semiconductor module 40 and the housing 42 extends slightly past substrate 46 in the lateral direction shown in FIG. 2. In the direction of the surface normal to this first main face, the substrate 46 extends past the housing 42 of a power semiconductor module 40. Electrical terminal elements 44 are disposed on a second main face of the power semiconductor module 40.

Each receptacle 12 has at least two stop means 20, preferably disposed diametrically opposite one another. These stop means 20 are preferably embodied as detent lugs, and these detent lugs do not protrude above the first main face 14 of the molded positioning body 10 in the direction of its surface normal. Detent lugs 20 serve to limit the motion of the power semiconductor module 40 in the direction of the surface normal to first main face 14 of molded positioning body 10. To that end, power semiconductor module 40, with its housing part 42 that protrudes laterally past substrate 46 and thus forms a stop edge 48, contacts the underside of detent faces 22 of detent lugs 20. Substrate 46 extends here past the detent lugs 20 and, together with the first main face 14 of the molded positioning body 10, forms a plane-parallel and aligned surface for the precise positioning of power semiconductor modules 40 within package 50.

By means of the described apparatus, having a molded positioning body 10 and a partial body 50 of a package with power semiconductor modules 40 disposed therein, individual power semiconductor modules 40 may be aligned with one another with a lateral positioning tolerance of 1 mm or less and a height tolerance between the planar first main face 14 of the molded positioning body 10 and the respective main faces of power semiconductor modules 40, formed by the respective substrate 46, of the power semiconductor modules 40 of less than 0.5 mm.

The method of the invention for simultaneous surface treatment of the substrates of a plurality of power semiconductor modules 40 is based here for example on the disposition of the power semiconductor modules 40 in a partial body 50 of a package which itself provides little lateral positioning precision of the power semiconductor modules disposed therein. By means of the molded positioning body 10, which is positioned above the power semiconductor modules 40 in the direction of the surface normal to its second main face, the power semiconductor modules may be aligned with one another laterally to the required tolerances. By means of this apparatus of the invention, the power semiconductor modules 40 are positioned more precisely in their desired location.

After positioning, the first main faces of power semiconductor modules 40 can be coated. This coating is effected either over the full surface, in which case the entire substrate 46 is covered with a layer of homogeneous thickness, or in portions, in which case, for example, identical islands 60 of a desired coating having the same spacing from one another are applied to the respective substrates 46 of the various power semiconductor modules 40.

By means of the method recited, heat-conducting pastes and adhesives, or other material, can preferably be applied to substrates 46. Methods that are especially preferred for this are known screenprinting or template printing methods.

Figure 3:
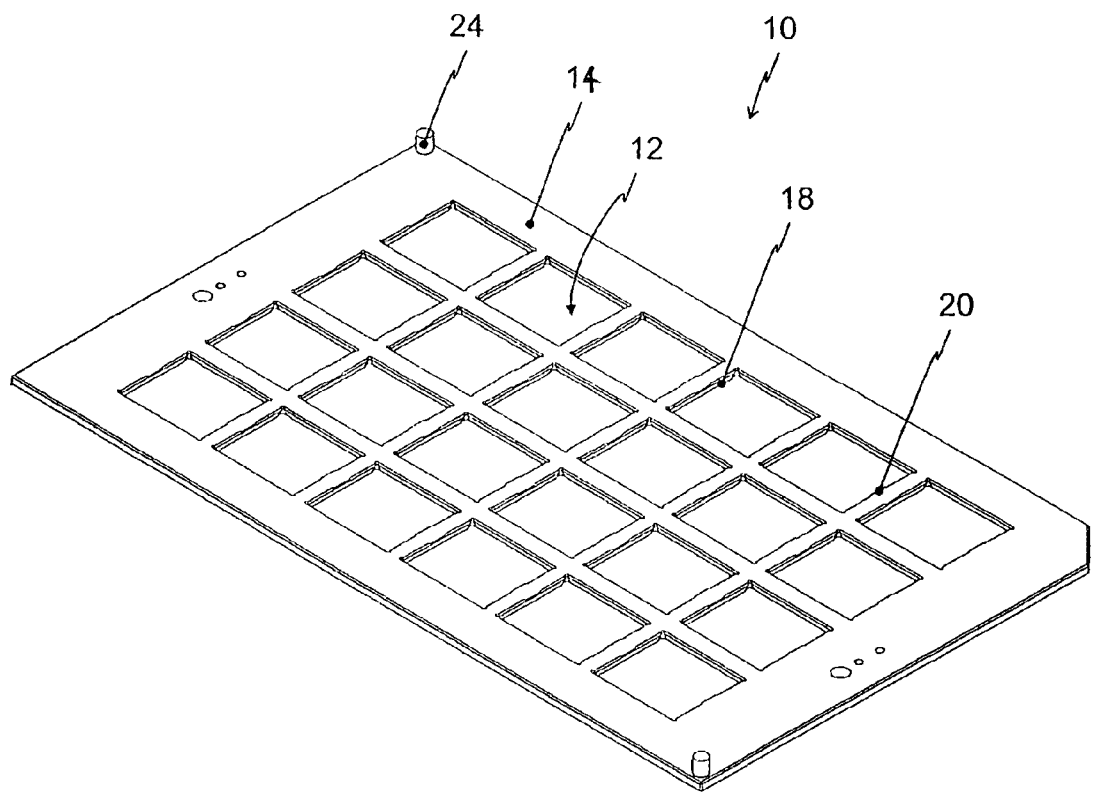
FIG. 3 shows a three-dimensional view of a detail of a molded positioning body of the apparatus of the invention.

FIG. 3 shows a three-dimensional view of a molded positioning body 10 of the apparatus of the invention. The design of the stop means 20 in the form of detent lugs, and the tapered course 18 of the receptacles 12, are especially clear in this view. Molded positioning body 10 moreover has at least two pegs 24, preferably located on diametrically opposite corners, which together act as a positioning device. The frame of a screen used to apply the coating, not shown, has corresponding receptacles to receive pegs 24. Pegs 24 of the molded positioning body are received in the associated receptacles and thus, during the screenprinting process, the printing screen may be aligned with precision relative to the power semiconductor modules 40 that are to be printed.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for simultaneous surface treatment of a plurality of power semiconductor modules, comprising the steps of:

disposing the power semiconductor modules within an apparatus for receiving and positioning a plurality of power semiconductor modules, spaced apart from one another, the apparatus including:

a molded positioning body having a planar first main top face, an opposed second main face having electrical terminal elements of the power semiconductor modules thereon, and a plurality of receptacles therein for receiving the power semiconductor modules;

wherein each receptacle has a stop means, by means of which one main top face of each power semiconductor module may be positioned plane-parallel to, and in alignment with, the first main top face of the molded positioning body; and wherein the receptacle has sides which taper inward from the second main face towards the first main top face;

fixing the power semiconductor modules within the apparatus; and coating at least a portion of surface of the power semiconductor modules which is exposed through the receptacles.

2. The method as defined by claim 1,
wherein the coating is effected by means of template printing.

3. The method as defined by claim 1,
wherein the coating is effected by means of screenprinting.

4. The method as defined by claim 1,
wherein the material is an adhesive.

5. The method as defined by claim 1,
wherein the material is a heat-conducting paste.

6. An apparatus for receiving and positioning a plurality of power semiconductor modules, spaced apart from one another, the apparatus comprising:

a rigid positioning body having a planar first main top face, an opposed second main face having electrical terminal elements of the power semiconductor modules thereon, and a plurality of receptacles therein for receiving the power semiconductor modules; and a plurality of power semiconductor modules, each power semiconductor module having one main top face positioned plane-parallel to, and in alignment with, the first main top face of the rigid positioning body and stop edges, wherein said second main face includes a respective plurality of openings therein, each of said openings being sized to be larger than said power semiconductor modules, to permit the unobstructed placement of respective ones of said power semiconductor modules in corresponding ones of said receptacles;

wherein each receptacle has a stop having at least two detent lugs, which do not protrude past the first main top face of the rigid positioning body, which are disposed in the interior of the receptacles adjacent said first main top face, which are configured to contact the stop edges of the power semiconductor modules when the power semiconductor modules are disposed therein and which limit the displacement of the power semiconductor module to be disposed within the apparatus in the direction of the surface normal to said first main top face of said rigid positioning body;

wherein each receptacle has sides which taper inward from the second main face towards the first main top face; and wherein said receptacles are arranged in a non-linear matrix.

7. The apparatus as defined by claim 6,
wherein the rigid positioning body is configured to be disposed over a partial body of a package of power semiconductor modules.

8. The apparatus as defined by claim 6,
wherein the power semiconductor modules each include an associated substrate that forms the aligned main top face of the power semiconductor module; and wherein the stop edges of the power semiconductor modules are formed by a housing of the respective power semiconductor module, which housing protrudes, in the direction of at least two edges or in the direction of the corners of the receptacle, past the associated substrate.

9. The apparatus as defined by claim 6,
wherein the height tolerance between the planar first main top face of the rigid positioning body and the respective associated main top faces of the power semiconductor modules is less than about 0.5 mm.

10. The apparatus as defined by claim 6,
wherein the rigid positioning body has at least two positioning devices for aligning a screenprinting device therewith.

11. The apparatus as defined by claim 6, in which each stop is positioned at or near the planar first main top face of the rigid positioning body.

* * * * *